Oct. 29, 1957 F. C. KUCH 2,811,700

ELECTRICAL CONNECTOR FOR PRINTED WIRING BOARD

Filed May 14, 1956

INVENTOR
F. C. KUCH
BY
H. W. Lockhart
ATTORNEY

United States Patent Office 2,811,700

Patented Oct. 29, 1957

2,811,700

ELECTRICAL CONNECTOR FOR PRINTED WIRING BOARD

Frederick C. Kuch, New Providence, N. J., assignor to Bell Telephone Laboratories, Incorporated, New York, N. Y., a corporation of New York Application May 14, 1956, Serial No. 584,548

1 Claim. (Cl. 339—17)

Figure 1:
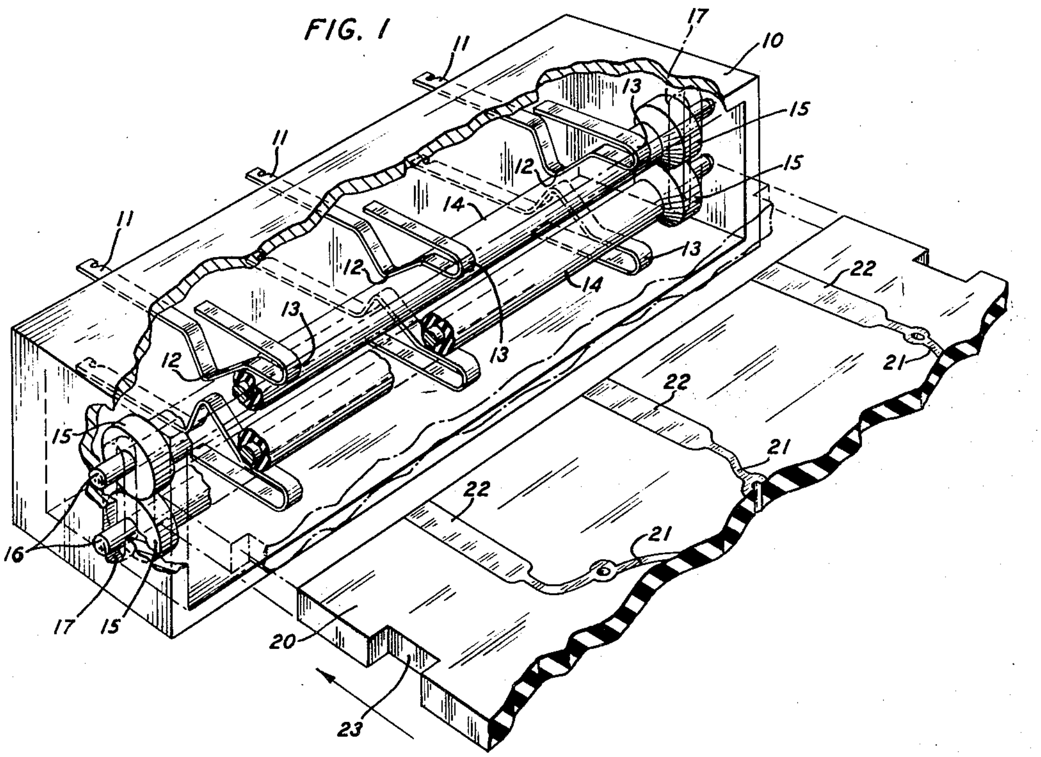

This invention relates to electrical connectors and more particularly to socket-type connectors for printed wiring boards.

Printed wiring boards for mounting and interconnecting electrical components have been widely adopted in recent years, particularly in the electronics art. For convenience of interconnection such boards generally are fashioned with terminal strip portions aligned in parallel arrangement along one edge of the printed wiring board. This edge is then used as a plug for insertion into a connector which may comprise an array of spring members mounted in a suitable housing. Connection may then be made to the spring contact members externally by a variety of means such as soldered wire or wrapped wire connections.

One primary disadvantage of this basic arrangement of a printed wiring board interconnection is the very considerable amount of wear upon the terminal strip portions of the printed wiring board, caused by repeated insertions and withdrawals of the board within the connector. There are other incidental deleterious effects arising from these insertion and withdrawal operations such as peeling of the terminal foil strips and snagging of the spring contact members upon the edge of the boards with consequent distortion of the spring members.

One object of this invention is an improved socket-type connector for printed wiring boards having foil strip terminals.

A more specific object is a socket-type connector in which there is substantially no wear but a slight amount of desirable wiping contact between the terminal strip on the board and the spring contact member during insertion and withdrawal of the board.

A further object is a socket-type connector having a high degree of reliability of contact pressure between the spring member and the terminal strip of the wiring board.

One embodiment of the socket-type connector of this invention includes a pair of insulated rollers with enlarged ends mounted in parallel relation within a socket housing and arranged to permit the insertion of a printed wiring board therebetween. The rollers are mounted to permit transverse displacement within the socket housing and are arranged so as to bear against looped portions of spring contact members. Insertion of a printed wiring board between the rollers and in engagement with the enlarged ends thereof displaces each roller outwardly from the centerline, thereby biasing each spring contact member away from the center or contact location within the housing. Thus, as the board is inserted the spring contact members are forced away from wiping contact with the board. Just prior to the moment when the board reaches the fully inserted position, the enlarged portions on the rollers against which the printed wiring board bears drop into notches in the opposite edges of the board, thereby permitting the rollers to move back to their abutting relation, relieving the bias on the spring contact members. This enables each spring contact member to bear against the corresponding terminal strip on the printed wiring board.

Therefore, a feature of this invention is an insulated roller member for biasing spring contact members away from the contact position during the insertion and withdrawal of a printed wiring board.

A further feature is the enlarged portions of the roller member for cooperating with notches in the printed wiring board to enable return of the spring contact members to the contact position, thereby providing also a latching arrangement for holding the printed wiring board in the socket against accidental disengagement.

Another feature of the socket-type connector of this invention is a spring contact member having a protruding nose portion for making contact with a terminal strip on a printed wiring board and a loop portion for resisting displacement of said member.

Figure 2A:
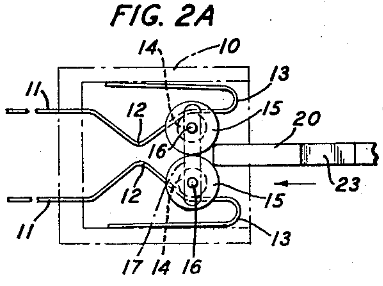
Figure 2B:
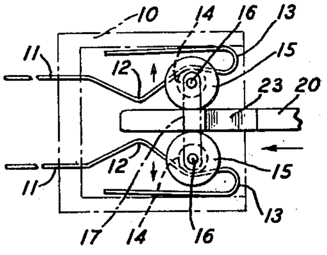
Figure 2C:
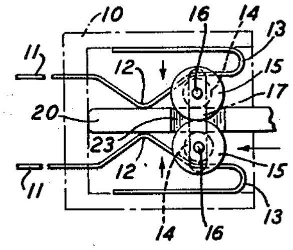

A better understanding of the invention and its other objects and features may be had from the following description taken in connection with the drawing in which:

Fig. 1 is a perspective view of one illustrative socket connector in accordance with this invention and a terminal edge of a printed wiring board with certain portions broken away; and Fig. 2 comprises three parts, all showing in schematic form an end view of the connector of this invention; Fig. 2A representing the relative position of parts prior to insertion of the printed wiring board; Fig. 2B showing the board partially inserted; and Fig. 2C showing the board fully inserted within the connector.

In Fig. 1 the connector is shown to comprise an insulating housing member 10 of generally box-like form which conveniently may be of a molded phenolic material. Molded or otherwise mounted within the housing are two opposed rows of spring contact members 11 each having a portion protruding from the housing for making an external wire connection thereto. Each spring contact member has a nose or contact portion 12 for contacting a terminal on the printed wiring board and a looped portion 13 having one leg resting against the wall of the housing, thereby biasing the contact portion away from the wall of the housing. Such spring contact members may advantageously be fashioned from beryllium copper or phosphor bronze having a desirable degree of hardness and resiliency and suitably plated to enhance the electrical properties.

Longitudinally disposed within the connector housing 10 are a pair of rollers 14 which likewise may be of a molded phenolic or other insulating material having a high degree of resistance to wear. Each roller is mounted on a metal shaft 16 which is retained within elongated holes 17 transversely disposed in the ends of the socket housing 10. The abutting portions of the rollers are enlarged cylindrical sections 15 at each end and immediately adjacent the ends of the socket housing.

A portion of a printed wiring board 20 is shown in position preparatory to insertion into the socket. Portions of the printed circuits 21 are shown leading to terminal strip portions 22, formed upon the board in the same fashion in which the printed circuits themselves are produced. Each terminal strip portion 22 is aligned with a spring contact member 11 of the socket connector. Notches 23 are formed on the side edges of the board a suitable distance away from the terminal edge of the board.

The cooperation of the various parts of this assemblage may be observed from an examination of the three parts of Fig. 2.

In Fig. 2A the printed wiring board 20 is shown in position preparatory to insertion between the rollers having enlarged portions 15. The looped portions 13 of the spring contact members are shown resting against the smaller diameter of the insulating rollers 14 and the nose or contact portions 12 of the spring contact members are shown in their closest relation.

In Fig. 2B the printed wiring board 20 has been partially inserted so that the enlarged portions 15 of the rollers 14 engage the surface of the printed wiring board. The roller members are thus forced apart as enabled by the mounting of their shafts 16 in the elongated holes 17. The looped portions 13 of the spring contact members thus are compressed to force the contact portions 12 away from the center or contact position. In this condition there is no wiping of the terminal strips 22 by the contact portions 12.

This relationship of the contact members continues until the board reaches the position illustrated in Fig. 2*C*. Here the board has been inserted to its full depth and the notches 23 in the side edges of the printed wiring board 20 have enabled the enlarged portions 15 of the roller members 14 to move back toward the centerline of the socket under the influence of the opposed spring contact members. As the bias is relieved on the spring contact members the contact portions 12 move inwardly, as indicated by the two small arrows, and into firm contacting relation with the terminal strip on the printed wiring board. In this position a small amount of clearance exists between the spring member 13 and the roller 14 to insure a reliable contact between the contact member 12 and the terminal strip 22. Thus, only at the very last instant of insertion, when the roller members spring back to their unbiased condition, is contact made between the spring members 11 and the terminal portions 22 of the printed wiring board. The length of each notch is slightly more than that required to enable the enlarged portions of the rollers to return to their abutting positions, hence this return action occurs before the board is fully seated in the socket. As a result, during this brief interval there occurs a slight and desirable wiping or rubbing action between the two contacting members.

Withdrawal of the printed wiring board is a reversal of the steps described above. As soon as withdrawal is started, the roller members 14 "ride up" on the printed wiring board surface, thereby moving apart and carrying the nose portions 12 of spring contact members therewith. Thus, when the withdrawal begins there will be an almost immediate opening of the contact between the spring members and the terminal portions of the printed wiring board with only very slight wiping during such withdrawal.

While the specific embodiment shown and described herein comprises three contact members on opposite sides of a connector, it will be apparent that a variety of arrangements may be made using a greater or lesser number of contacts, or in some cases, contact members may be employed on only one side of a socket and only one roller member need be included.

Although only one specific embodiment of this invention has been shown and described, it will be understood that it is but illustrative and that various modifications may be made therein without departing from the scope and spirit of this invention.

What is claimed is:

An electrical connector for printed wiring boards comprising in combination a printed wiring board having terminal strip portions alone one edge and a notch in both of the edges adjacent said one edge, a trough-like insulating receptacle member for receiving said terminal edge of said board, spring contact members mounted in spaced apart relation in said receptacle member, each said spring member having a loop portion for biasing said spring member away from an inner side wall of said receptacle member and a contact portion for contacting a terminal strip on said board, a roller member of insulating material longitudinally mounted in said receptacle member and bearing against the loop portion of each said spring member, said roller member having enlarged end portions and being adapted for transverse displacement in said receptacle member whereby insertion of said board urges said roller member against said loop portions, thereby compressing said loop portions and biasing said contact portions away from said board, said enlarged portions of said roller member engaging the notches in said printed wiring board when said board is fully inserted in said receptacle member whereby the compression of said loop portions is relieved and the contact portions move into contact with the terminal strips on said board, and means for making another electrical connection to each said spring contact member.

References Cited in the file of this patent

UNITED STATES PATENTS

| | | |
|---|---|---|
| 2,711,523 | Willis | June 21, 1955 |
| 2,748,364 | Kamm | May 29, 1956 |